(12) United States Patent
Kato et al.

(10) Patent No.: US 9,057,758 B2
(45) Date of Patent: Jun. 16, 2015

(54) METHOD FOR MEASURING CURRENT, METHOD FOR INSPECTING SEMICONDUCTOR DEVICE, SEMICONDUCTOR DEVICE, AND TEST ELEMENT GROUP

(75) Inventors: Kiyoshi Kato, Kanagawa (JP); Yusuke Sekine, Kanagawa (JP); Yutaka Shionoiri, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 668 days.

(21) Appl. No.: 12/967,230

(22) Filed: Dec. 14, 2010

(65) Prior Publication Data

US 2011/0148455 A1 Jun. 23, 2011

(30) Foreign Application Priority Data

Dec. 18, 2009 (JP) ................. 2009-287978

(51) Int. Cl.
*G01R 31/02* (2006.01)
*G01R 31/27* (2006.01)
*G01R 19/00* (2006.01)
(Continued)

(52) U.S. Cl.
CPC .......... *G01R 31/275* (2013.01); *G01R 19/0092* (2013.01); *G01R 31/2884* (2013.01); *G09G 3/20* (2013.01); *G09G 2320/029* (2013.01)

(58) Field of Classification Search
CPC ............. G01R 31/0092; G01R 31/275; G01R 31/2601
USPC ................. 324/686, 762.01, 762.11
See application file for complete search history.

(56) References Cited

U.S. PATENT DOCUMENTS 4,801,878 A * 1/1989 Peiffer et al. .............. 324/750.3
5,731,856 A   3/1998 Kim et al.
5,744,864 A   4/1998 Cillessen et al.
(Continued)

FOREIGN PATENT DOCUMENTS

EP   1 737 044 A1   12/2006
EP   2 226 847 A2    9/2010
(Continued)

OTHER PUBLICATIONS

Donald C. Thelen et al.; "A Low Noise Readout Detector Circuit for Nanoampere Sensor Applications"; IEEE Journal of Solid-State Circuits; Mar. 1997; pp. 337-348; vol. 32, No. 3.
(Continued)

*Primary Examiner* — Jermele M Hollington
*Assistant Examiner* — Demetrius Pretlow
(74) *Attorney, Agent, or Firm* — Fish & Richardson P.C.

(57) ABSTRACT

An object is to provide a current measurement method which enables a minute current to be measured. To achieve this, the value of a current flowing through an electrical element is not directly measured, but is calculated from a change in potential observed in a predetermined period. The detection of a minute current can be achieved by a measurement method including the steps of applying a predetermined potential to a first terminal of an electrical element comprising the first terminal and a second terminal; measuring an amount of change in potential of a node connected to the second terminal; and calculating, from the amount of change in potential, a value of a current flowing between the first terminal and the second terminal of the electrical element.

17 Claims, 12 Drawing Sheets

(51) Int. Cl.
*G01R 31/28* (2006.01)
*G09G 3/20* (2006.01)

(56) References Cited

U.S. PATENT DOCUMENTS

| | | | |
|---|---|---|---|
| 6,028,438 A * | 2/2000 | Gillette | 324/762.01 |
| 6,239,609 B1 * | 5/2001 | Sugasawara et al. | 324/762.02 |
| 6,294,274 B1 | 9/2001 | Kawazoe et al. | |
| 6,486,566 B1 * | 11/2002 | Schumacher et al. | 307/10.1 |
| 6,552,562 B2 * | 4/2003 | Nagai et al. | 324/756.06 |
| 6,563,174 B2 | 5/2003 | Kawasaki et al. | |
| 6,727,522 B1 | 4/2004 | Kawasaki et al. | |
| 6,788,088 B2 * | 9/2004 | Throngnumchai | 324/750.3 |
| 7,005,882 B2 * | 2/2006 | Kiep | 324/762.08 |
| 7,049,190 B2 | 5/2006 | Takeda et al. | |
| 7,049,833 B2 * | 5/2006 | Kunst et al. | 324/713 |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,586,324 B2 * | 9/2009 | Miyagawa | 324/760.01 |
| 7,633,286 B2 * | 12/2009 | Kajita | 324/120 |
| 7,674,650 B2 | 3/2010 | Akimoto et al. | |
| 7,732,819 B2 | 6/2010 | Akimoto et al. | |
| 7,812,628 B2 * | 10/2010 | Otsuga et al. | 324/750.3 |
| 7,859,306 B2 * | 12/2010 | Inakawa | 326/83 |
| 7,863,908 B2 * | 1/2011 | Wappis et al. | 324/678 |
| 8,049,523 B2 * | 11/2011 | Gazit | 324/713 |
| 2001/0019274 A1 | 9/2001 | Goto | |
| 2001/0046027 A1 | 11/2001 | Tai et al. | |
| 2002/0041190 A1 * | 4/2002 | Hashimoto | 324/765 |
| 2002/0056838 A1 | 5/2002 | Ogawa | |
| 2002/0097053 A1 * | 7/2002 | Tamagawa et al. | 324/382 |
| 2002/0132454 A1 | 9/2002 | Ohtsu et al. | |
| 2003/0001585 A1 * | 1/2003 | Montrose | 324/519 |
| 2003/0057987 A1 * | 3/2003 | Ohlhoff et al. | 324/763 |
| 2003/0076084 A1 * | 4/2003 | Elbanhawy | 324/72 |
| 2003/0107395 A1 * | 6/2003 | Kawasaki et al. | 324/765 |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0279306 A1 * | 12/2006 | Miyakawa et al. | 324/763 |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0310648 A1 * | 12/2008 | Smith | 381/86 |
| 2009/0021271 A1 * | 1/2009 | Bernacchia et al. | 324/693 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0225478 A1 * | 9/2009 | Kido et al. | 361/18 |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0068819 A1 * | 3/2011 | Sims et al. | 324/764.01 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-318950 A | 11/1992 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2001-249147 A | 9/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |

(56) References Cited

FOREIGN PATENT DOCUMENTS

| | | |
|---|---|---|
| JP | 2004-273732 A | 9/2004 |
| WO | 2004/114391 A1 | 12/2004 |

OTHER PUBLICATIONS

Tung-Li Shen et al.; "A 2-ns. Detecting Time, 2-um CMOS Built-in Current Sensing Circuit"; IEEE Journal of Solid-State Circuits; Jan. 1993; pp. 72-77; vol. 28, No. 1.

Kenji Nomura et al.; "Thin-Film Transistor Fabricated in Single-Crystalline Transparent Oxide Semiconductor"; Science; May 23, 2003; pp. 1269-1272; vol. 300.

Kenji Nomura et al.; "Room-temperature fabrication of transparent flexible thin-film transistors using amorphous oxide semiconductors"; Nature; Nov. 25, 2004; pp. 488-492; vol. 432.

Ryo Hayashi et al.; "42.1: Invited Paper: Improved Amorphous In-Ga-Zn-O TFTs"; SID Digest '08; May 20, 2008; pp. 621-624.

Kenji Nomura et al.; "Thin-Film Transistor Fabricated in Single-Crystalline Transparent Oxide Semiconductor," Science, May 23, 2003, vol. 300, No. 5623, pp. 1269-1272.

Ryo Hayashi et al.; "42.1: Invited Paper: Improved Amorphous In-Ga-Zn-O TFTs," SID Digest '08, May 20, 2008, vol. 39, pp. 621-624.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Veno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

(56) References Cited

OTHER PUBLICATIONS

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C, Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=in,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Naoshi Suzuki; "Principle of Low-current Measurement and Actual Picoammeter"; Applied Physics; 2001; pp. 868-871; vol. 70, No. 7, with English translation.

\* cited by examiner

FIG. 2A

|  | initialization period | measurement period |
|---|---|---|
| V1 | VDD | |
| V2 | VSS | |
| V3 | | |

FIG. 2B

|  | initialization period | measurement period |
|---|---|---|
| V1 | VDD | |
| V2 | VSS | |
| V3 | | |
| Vext_b | | | ered to as off-state

METHOD FOR MEASURING CURRENT, METHOD FOR INSPECTING SEMICONDUCTOR DEVICE, SEMICONDUCTOR DEVICE, AND TEST ELEMENT GROUP

BACKGROUND OF THE INVENTION

1. Field of the Invention

The present invention relates to a method for measuring a minute current flowing through an electrical element, an inspection method of a semiconductor device employing the current measurement method, a semiconductor device employing the current measurement method, a semiconductor device employing the inspection method, a test element group, and the like. Here, a semiconductor device may be any device which works by utilizing semiconductor characteristics. Examples of semiconductor devices include, in a broad sense, semiconductor elements (including so-called power devices) such as transistors, diodes, and thyristors; integrated circuits such as image sensors, memories, and converters; integrated circuits including any of these semiconductor elements and integrated circuits; and display devices typified by liquid crystal display devices.

2. Description of the Related Art

In recent years, research on thin film transistors using In—Ga—Zn based metal oxide has been brisk (see Patent Document 1, Non-Patent Document 1, and Non-Patent Document 2, for example). The research is proceeding with a view mainly to replacing silicon based thin film transistors used in display devices with thin film transistors using In—Ga—Zn based metal oxide.

By the way, in the case of fabricating semiconductor devices that need charge retention, such as liquid crystal display devices, it is extremely important to know the characteristics of thin film transistors in the off state, e.g., the value of a current flowing between the source and the drain of a transistor in the off state (hereinafter referred to as off-state current), and the like. This is because the parameters of a thin film transistor such as channel length and channel width are determined in accordance with the characteristics of the thin film transistor in the off state.

For now, it has been reported that the off-state current of a transistor using amorphous In—Ga—Zn based metal oxide is less than $10^{-14}$ A (see Non-Patent Document 3, for example).

REFERENCE

Patent Document

[Patent Document 1] Japanese Published Patent Application No. 2004-103957

Non-Patent Document

[Non-Patent Document 1] K. Nomura, H. Ohta, K. Ueda, T. Kamiya, M. Hirano, and H. Hosono, "Thin-film transistor fabricated in single-crystalline transparent oxide semiconductor", SCIENCE, 2003, Vol. 300, pp. 1269-1272

[Non-Patent Document 2] K. Nomura, H. Ohta, A. Takagi, T. Kamiya, M. Hirano, and H. Hosono, "Room-temperature fabrication of transparent flexible thin-film transistors using amorphous oxide semiconductors", NATURE, 2004, Vol. 432 pp. 488-492

[Non-Patent Document 3] R. Hayashi, A. Sato, M. Ofuji, K. Abe, H. Yabuta, M. Sano, H. Kumomi, K. Nomura, T. Kamiya, M. Hirano, and H. Hosono "Improved Amorphous In—Ga—Zn—O TFTs", SID DIGEST '08, pp. 621-624

SUMMARY OF THE INVENTION

However, as shown in Non-Patent Document 3, the lowest detection limit has been approximately 10 fA (femtoamperes (1 fA equals $10^{-15}$ A)) in measuring the off-state current, which is one of the transistor characteristics. For this reason, if the off-state current is lower than the lowest detection limit, it has been difficult to know its precise value.

Such a situation may cause a delay in developing electrical elements typified by thin film transistors. If the transistor characteristics cannot be precisely measured, the development of devices or circuits based on new characteristic values and the development of application products do not progress.

In view of the above problem, an object of one embodiment of the present invention is to provide a current measurement method that enables a minute current to be measured, to provide an inspection method of a semiconductor device employing the current measurement method, to provide a semiconductor device employing the current measurement method, to provide a semiconductor device employing the inspection method, or to provide a test element group.

According to the present invention, the value of a current flowing through an electrical element is not directly measured, but is calculated from a change in potential observed in a predetermined period. Specifically, a current flowing through an electrical element is calculated from the amount of change in charge in a capacitor connected to the electrical element, thereby allowing the value of a minute current to be detected, unlike a conventional method in which a voltage drop across a resistor is amplified, and then read (e.g. picoammeters). The following method can be used, for example.

One embodiment of the present invention is a method for measuring current, comprising the steps of: applying a predetermined potential to a first terminal of an electrical element comprising the first terminal and a second terminal; measuring an amount of change in potential of a node connected to the second terminal; and calculating, from the amount of change in potential, a value of a current flowing between the first terminal and the second terminal of the electrical element.

One embodiment of the present invention is a method for measuring current, comprising the steps of: applying a predetermined potential to a first terminal of an electrical element comprising the first terminal and a second terminal and thus supplying charge to a node connected to the second terminal; measuring an amount of change in potential of the node due to a change in an amount of charge held in the node; and calculating, from the amount of change in potential, a value of a current flowing between the first terminal and the second terminal of the electrical element.

In the above methods for measuring current, the electrical element is a transistor in which a current flowing between a source and a drain when the transistor is in an off state is less than $10^{-14}$ A; the first terminal is one of the source and the drain; the second terminal is the other of the source and the drain; and by forcing the transistor into the off state, a value of a current flowing when the transistor is in an off state is calculated.

In the above methods for measuring current, a capacitor can be connected to the node, thereby offering the advantage that the potential of the node is easily controlled.

It is possible to examine whether or not an electrical element has predetermined characteristics by using the above current measurement method. Consequently, defects in a fabricated semiconductor device can be detected. Further, it is also possible to design a semiconductor device using a parameter measured by this inspection method. Consequently, the quality of the semiconductor device can be increased.

It is possible to fabricate a semiconductor device by determining the parameters of electrical elements, which are components of the semiconductor device, on the basis of the value of the current obtained by the above current measurement method. Consequently, a semiconductor device having preferred characteristics can be provided.

One embodiment of the present invention is a test element group including an electrical element comprising a first terminal and a second terminal, a capacitor, and an output circuit. The first terminal of the electrical element is a terminal to which a potential from a power source is applied. The second terminal of the electrical element is connected to a first terminal of the capacitor and an input terminal of the output circuit.

In the above test element group, a predetermined potential is applied to the first terminal of the electrical element in order to calculate, from an amount of change in a potential of an output terminal of the output circuit, a value of a current flowing between the first terminal and the second terminal of the electrical element.

In the above test element group, the electrical element is a transistor in which a current flowing between a source and a drain when the transistor is in an off state is less than $10^{-14}$ A; the first terminal is one of the source and the drain; and the second terminal is the other of the source and the drain.

Note that in this specification, the terms like "above" and "below" do not necessarily mean "directly above" and "directly below", respectively, in the description of a physical relationship between components. For example, the expression "a gate electrode over a gate insulating layer" can correspond to a situation where there is an additional component between the gate insulating layer and the gate electrode. The terms "above" and "below" are just used for convenience of explanations and they can be interchanged unless otherwise specified.

In this specification, the term "electrode" or "wiring" does not limit the function of components. For example, an "electrode" can be used as part of a "wiring", and the "wiring" can be used as part of the "electrode". In addition, the term "electrode" or "wiring" can also mean a combination of a plurality of "electrodes" and "wirings", for example.

The function of a "source" and the function of a "drain" may be interchanged depending on the conductivity type of transistors employed or depending on the direction of current flow induced by the circuit operation. Therefore, the terms "source" and "drain" can be interchanged in this specification.

Note that in this specification and the like, the term "electrically connected" means, for example, the case where components are connected via "an object having any electric function". There is no particular limitation on the object having any electric function as long as electric signals can travel between components connected to each other via the object.

Examples of the "object having any electric function" include an electrode or a wiring; a switching element such as a transistor; a resistor; an inductor; a capacitor; and an element with any other functions (an electrical element).

In one embodiment of the present invention, the value of a current is calculated from a change in potential observed in a predetermined period. Thus, the value of a minute current can be measured.

Further, by examining whether or not an electrical element has predetermined characteristics using the above current measurement method, defects in a fabricated semiconductor device can be accurately discovered.

A semiconductor device having preferred characteristics can be provided by determining the parameters of an electrical element which is a component of the semiconductor device on the basis of the data on current values obtained by the above current measurement method.

As described above, one embodiment of the present invention produces various technical effects.

BRIEF DESCRIPTION OF THE DRAWINGS

FIGS. 2A and 2B are diagrams (timing charts) showing voltage levels related to the operation of the system of measurement.

DETAILED DESCRIPTION OF THE INVENTION

Figure 1:
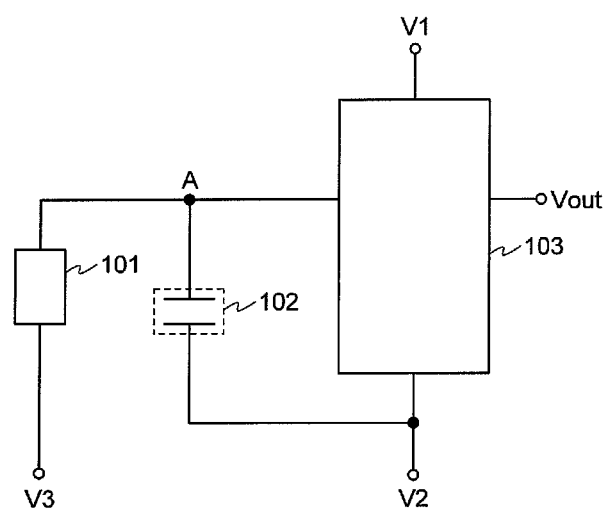
FIG. 1 is a circuit diagram showing an example of a system of measurement.

The embodiments and example of the present invention will be described below using the accompanying drawings. Note that the present invention is not limited to the following description, and it is easily understood by those skilled in the art that modes and details disclosed herein can be modified in various ways without departing from the spirit and the scope of the present invention. Therefore, the invention should not be construed as being limited to the description in the following embodiments.

Note that, in some cases, the position, size, range, and the like of each component illustrated in the drawings and the like do not indicate actual ones in order to facilitate understanding. Therefore, the present invention is not necessarily limited to the position, size, range, and the like shown in the drawings and the like.

Note that ordinal numbers such as "first", "second" and "third" in this specification are used just for preventing confusion between components, and thus do not limit number.

Embodiment 1

In this embodiment, an example of a current measurement method according to one embodiment of the present invention and a system of measurement used for the current measurement method will be described with reference to FIG. 1.
<System of Measurement>

First, one example of a system of measurement used for the current measurement method according to one embodiment of the present invention will be described with reference to FIG. 1. The configuration of a system of measurement below can be used as the configuration of a test element group. Note that the system of measurement below is only an example, and the present invention should not be construed as being limited thereto.

A system of measurement shown in FIG. 1 includes an electrical element 101, a capacitor 102, and an output circuit 103. The electrical element 101 includes a first terminal and a second terminal. The capacitor 102 includes a first terminal and a second terminal. The output circuit 103 includes an input terminal, an output terminal, a first terminal, and a second terminal.

In FIG. 1, the first terminal of the electrical element 101 is connected to a power source. The second terminal of the electrical element 101 is connected to the first terminal of the capacitor 102 and the input terminal of the output circuit 103. The second terminal of the capacitor 102 is connected to the second terminal of the output circuit and a power source. The first terminal of the output circuit 103 is connected to a power source.

The power source supplies a potential V3 to the first terminal of the electrical element 101. Further, the power source supplies a potential V2 to the second terminal of the capacitor 102 and to the second terminal of the output circuit 103. Furthermore, the power source supplies a potential V1 to the first terminal of the output circuit 103. A potential Vout is output from the output terminal of the output circuit 103.

Note that the capacitor 102 is not necessarily provided. The capacitance of the output circuit 103 or the electrical element 101 can be used as the capacitor 102.

In addition, a control signal or power supply potential other than those described above can be applied to the electrical element 101 or the output circuit 103, depending on the configuration.

<Current Measurement Method>

Next, an example of a current measurement method using the above-described system of measurement will be described with reference to FIGS. 2A and 2B and FIGS. 3A and 3B. Note that the current measurement method described below is only an example, and the present invention should not be construed as being limited thereto.

First, a potential difference is established between a node A, which is a node connected to the second terminal of the electrical element 101 (that is, a node connected to the first terminal of the capacitor 102 and the input terminal of the output circuit 103), and the first terminal of the electrical element 101, thereby allowing charge to flow through the electrical element 101. Then, a measurement period is started. In the measurement period, the potential of the first terminal of the electrical element 101 is fixed. On the other hand, the potential of the node A is not fixed (floating) in the measurement period. Hence, charge flows through the electrical element 101, and the potential of the node A changes over time. Further, the potential of the node A changes in accordance with the amount of charge held in the node A. In other words, Vout denoting the output potential of the output circuit 103 also changes.

The above-described application of a potential difference can be achieved by supplying charge to the node A and changing the potential of the node A. In the case where the conductance of the electrical element 101 is variable (e.g. the case where the electrical element 101 is a transistor or the like), the above-described application of a potential difference can be achieved by setting V3 high (or low) and applying this to the node A while the resistance of the electrical element 101 is set low, and then, setting the resistance of the electrical element 101 high and setting V3 low (or high). In addition, the above-described application of a potential difference can be achieved by making a difference between V2 and V3.

FIGS. 2A and 2B show the relation between the potentials (a timing chart) in the initialization period in which the potential difference is given and the subsequent measurement period. Here, two types of timing charts which are different in the method for giving a potential difference are shown.

FIG. 2A is an example of a timing chart in the case of using a method in which a potential is applied by supplying charge to the node A. In the initialization period, a probe needle or the like is forced into contact with the node A, and a desired potential is applied to the node A. After the application of the potential, the probe needle or the like is released from the node A, and the node A becomes floating. This method is characterized in that the potential V1, the potential V2, and the potential V3 do not need to be changed throughout the initialization period and the measurement period.

Note that in FIG. 2A, in the initialization period, V1 is VDD, but V1 may be VSS instead because V1 is a potential needed only in the measurement period. In addition, the potential V3 is set such that a desired potential is applied to the first terminal of the electrical element 101.

FIG. 2B is an example of a timing chart in the case where the conductance of the electrical element 101 is variable. In the timing chart, a potential Vext_b represents a potential that is applied to the electrical element 101 in order to vary the conductance of the electrical element. Note that a specific example of the electrical element 101 in this case is a transistor or the like.

In the initialization period, the potential Vext_b is set to such a potential that the conductance of the electrical element 101 is increased. For example, when the electrical element 101 is a transistor, the potential Vext_b is set to such a potential that the transistor is turned on. In FIG. 2B, the potential Vext_b is high. In this state, the conductance of the electrical element 101 is high, so that the potential V3 is applied to the node A. For this reason, in the initialization period, V3 is set so that the potential of the node A may become a desired one.

In the subsequent measurement period, the potential Vext_b is set so that the electrical element 101 may go into a desired state for the measurement. In the case where the electrical element 101 is a transistor, for example, if the transistor in the off state is desired to be measured, the potential Vext_b is set so that the transistor may be turned off. In addition, the potential V3 is set so that charge may flow into the node A or charge may flow from the node A. Note that in order to hold the potential of the node A, it is preferable that V3 be changed after Vext_b is changed.

Note that in FIG. 2B, V3 and Vext_b are both high in the initialization period and low in the measurement period. One embodiment of the present invention, however, is not limited this; V3 and Vext_b may be low and high respectively in the initialization period and high and low respectively in the measurement period.

Figure 3A:
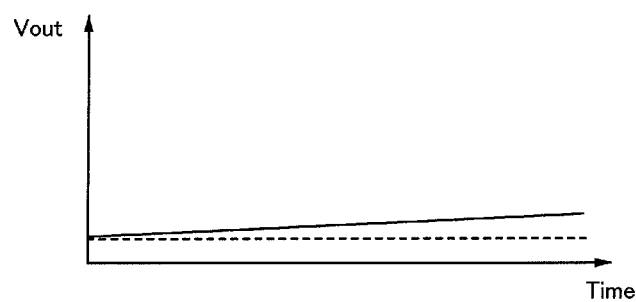
FIG. 3A is a graph showing an example of the relation between the elapsed time (Time) and an output potential (Vout)

When the measurement period starts after the above-described application of a potential difference, the amount of charge held in capacitors connected to the node A changes over time, and the potential of the node A thus changes. This means that the potential of the input terminal of the output circuit 103 changes. Consequently, the potential of the output terminal of the output circuit 103 also changes over time. FIG. 3A shows an example of the relation between the elapsed time and the output potential Vout.

Figure 3B:
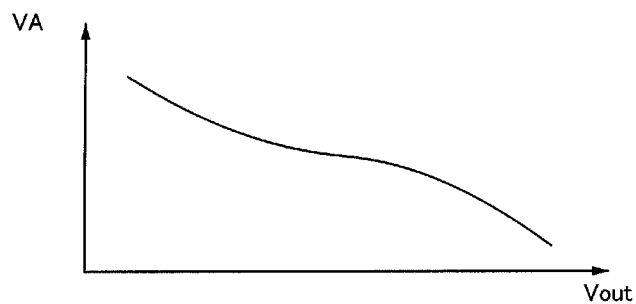
FIG. 3B is a graph showing an example of the relation between a potential VA and the output potential Vout.

When the relation between VA denoting the potential of the node A, and the output potential Vout has been already determined, the potential VA can be determined from the output potential Vout. FIG. 3B shows an example of the relation between the potential VA and the output potential Vout. In general, VA denoting the potential of the node A can be measured as a function of the output potential Vout and expressed by the following equation.

$$VA = F(Vout)$$

Electric charge QA denoting the electric charge in capacitors connected to the node A can be expressed by the following equation using the potential VA, CA denoting the capacitance of capacitors connected to the node A, and a constant (const). Here, the capacitance CA is the sum of the capacitance of the capacitor 102 and other capacitance (e.g. the capacitance of the output circuit 103).

$$QA = CA \cdot VA + \text{const}$$

IA denoting current flowing through the node A is the time derivatives of charge flowing to the node A (or charge flowing from the node A), so that the current IA is expressed by the following equation.

$$IA = \frac{\Delta QA}{\Delta t} = \frac{CA \cdot \Delta F(Vout)}{\Delta t}$$

As described above, the current IA can be determined from the capacitance CA and the output potential Vout of the output circuit 103.

Note that the current IA is the sum of Idev denoting a current flowing through the electrical element 101, and Ileak denoting a current other than the current Idev, so that in order to determine the current Idev with high accuracy, the measurement is preferably carried out with a system of measurement in which the current Ileak is sufficiently smaller than the current Idev. Alternatively, the accuracy in determining the current Idev may be increased by estimating the current Ileak and then subtracting it from the current IA.

A minute current flowing through an electrical element can be detected by the above-described method. A current value of 1 zA (zeptoampere (1 zA equals $10^{-21}$ A)) or less, for example, can be detected by the method described in this embodiment.

The structures and methods described in this embodiment can be combined as appropriate with any of those described in the other embodiments.

Embodiment 2

In this embodiment, other examples of the system of measurement described in Embodiment 1 will be described with reference to FIGS. 4A to 4C, FIG. 5, FIG. 6, and FIGS. 7A and 7B. Each of the configurations of the systems of measurement described below can be used as the configuration of a test element group. Note that each of the systems of measurement described below is only an example, and the present invention should not be construed as being limited thereto.
<System of Measurement>

Figure 4A:
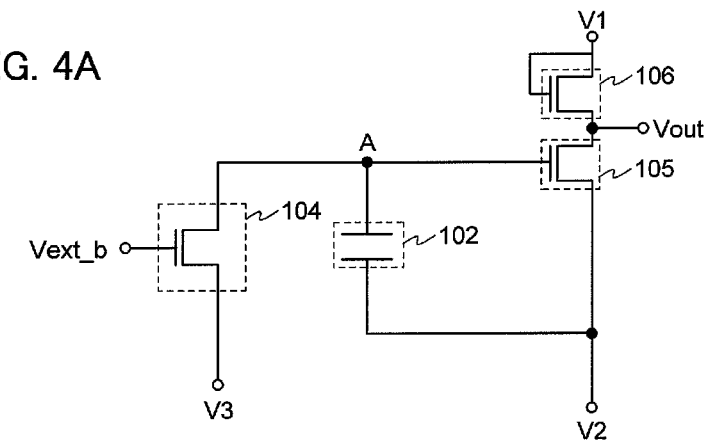
FIGS. 4A to 4C are circuit diagrams showing examples of a system of measurement.

A system of measurement shown in FIG. 4A includes a capacitor 102, a transistor 104, a transistor 105, and a transistor 106. Here, the transistor 104 corresponds to the electrical element 101 in FIG. 1. Further, the transistor 105 and the transistor 106 constitute a circuit corresponding to the output circuit 103 in FIG. 1.

In FIG. 4A, one of the source and drain terminals of the transistor 104 corresponds to the first terminal of the electrical element 101 in FIG. 1. Further, the other of the source and drain terminals of the transistor 104 corresponds to the second terminal of the electrical element 101.

In addition, in FIG. 4A, one of the source and drain terminals of the transistor 106 and the gate terminal of the transistor 106 are connected to each other, and thus constitute a terminal corresponding to the first terminal of the output circuit 103. Further, the other of the source and drain terminals of the transistor 106 and one of the source and drain terminals of the transistor 105 are connected to each other, and thus constitute a terminal corresponding to the output terminal of the output circuit 103. Further, the gate terminal of the transistor 105 corresponds to the input terminal of the output circuit 103. Further, the other of the source and drain terminals of the transistor 105 corresponds to the second terminal of the output circuit 103.

In other words, one of the source and drain terminals of the transistor 104 is connected to the power source. Further, the other of the source and drain terminals of the transistor 104, one terminal of the capacitor 102, and the gate terminal of the transistor 105 are electrically connected to each other. The other terminal of the capacitor 102 is connected to the other of the source and drain terminals of the transistor 105 and the power source. Further, one of the source and drain terminals of the transistor 106 and the gate terminal of the transistor 106 are connected to the power source.

Note that the potential Vext_b by which the on/off of the transistor 104 is controlled is applied to the gate terminal of the transistor 104.

Figure 4B:
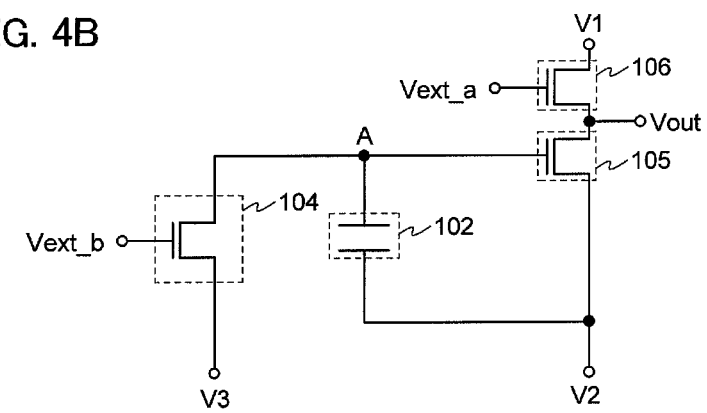

A system of measurement shown in FIG. 4B has a configuration partly different from that shown in FIG. 4A. In FIG. 4B, one of the source and drain terminals of the transistor 106 corresponds to the first terminal of the output circuit 103. Further, the potential Vext_a by which the on/off of the transistor 106 is controlled is applied to the gate terminal of the transistor 106. Further, the other of the source and drain terminals of the transistor 106 and one of the source and drain terminals of the transistor 105 are connected to each other, and thus constitute a terminal corresponding to the output terminal of the output circuit 103, and the output potential Vout is output from the terminal.

Figure 4C:
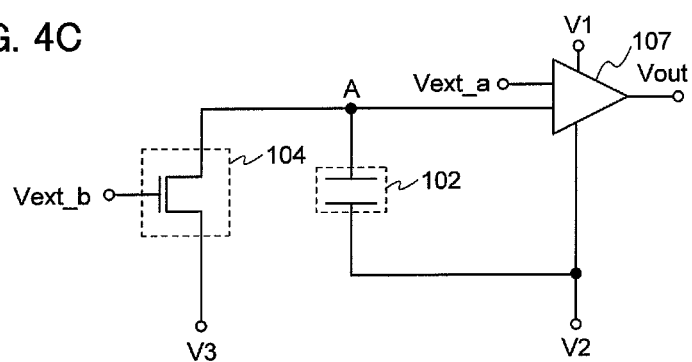

A system of measurement shown in FIG. 4C has a configuration partly different from those described above. In FIG. 4C, a sense amplifier circuit 107 forms a circuit corresponding to the output circuit 103 in FIG. 1. The sense amplifier circuit 107 includes a first input terminal, a second input terminal, an output terminal, a first terminal, and a second terminal.

Note that in the system of measurement shown in FIG. 4B and the system of measurement shown in FIG. 4C, a change in the potential of the node A can be determined with high accuracy by setting the potential Vext_a to an appropriate value.

Figure 5:
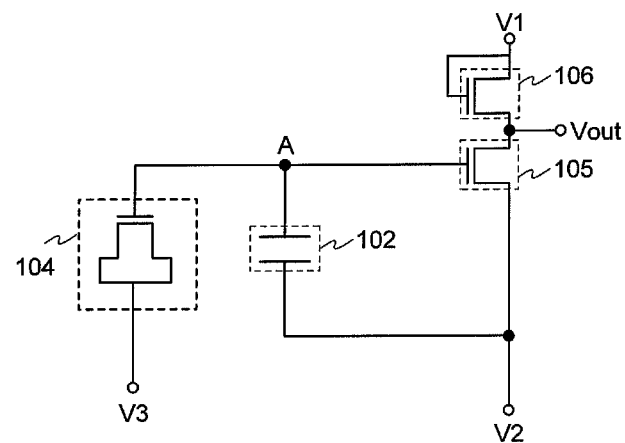
FIG. 5 is a circuit diagram showing an example of a system of measurement.

A system of measurement shown in FIG. 5 has a configuration partly different from that shown in FIG. 4A. The system of measurement in FIG. 5 is different from that in FIG. 4A in the connections of the transistor 104. In other words, in FIG. 5, one of the source and drain terminals of the transistor 104 and the other of the source and drain terminals of the transistor 104 are connected to each other, and thus constitute the first terminal of the electrical element 101 in FIG. 1.

Further, the gate terminal of the transistor 104 forms the second terminal of the electrical element 101.

As can be seen from the above configuration, the system of measurement shown in FIG. 5 enables the measurement of the gate leakage current of the transistor 104.

Figure 6:
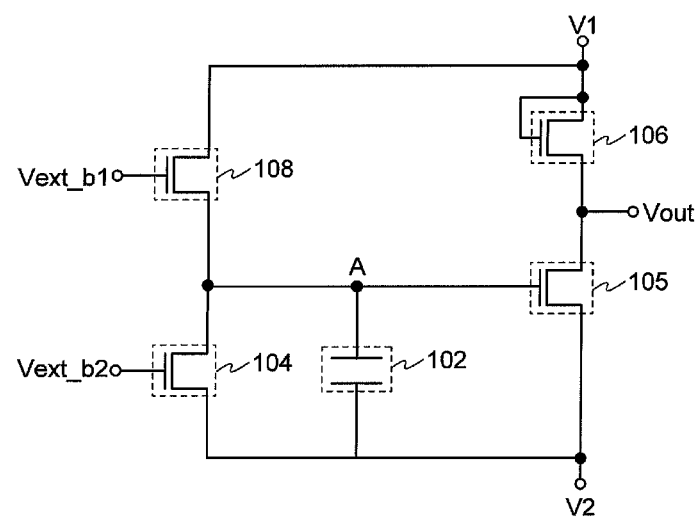
FIG. 6 is a circuit diagram showing an example of a system of measurement.

A system of measurement shown in FIG. 6 has a configuration partly different from that shown in FIG. 4A. Specifically, the system of measurement in FIG. 6 includes a transistor 108 which is in parallel with the transistor 104. Further, in FIG. 6, the power source supplying the potential V2 also serves as the power source which supplies the potential V3 in FIG. 4A.

Thus, one of the source and drain terminals of the transistor 104, the other terminal of the capacitor 102, and the other of the source and drain terminals of the transistor 105 are connected to the power source (which supplies V2). Further, the other of the source and drain terminals of the transistor 104, one of the source and drain terminals of the transistor 108, one terminal of the capacitor 102, and the gate terminal of the transistor 105 are electrically connected to each other. Further, the other of the source and drain terminals of the transistor 108, one of the source and drain terminals of the transistor 106, and the gate terminal of the transistor 106 are connected to the power source (which supplies V1). Further, one of the source and drain terminals of the transistor 105 is electrically connected to the other of the source and drain terminals of the transistor 106.

Note that a potential Vext_b2 for controlling the on/off of the transistor 104 is supplied to the gate terminal of the transistor 104, and a potential Vext_b1 for controlling the on/off of the transistor 108 is supplied to the gate terminal of the transistor 108.

As can be seen from the above configuration, in the system of measurement shown in FIG. 6, the transistor 104 and the transistor 108 are connected in series. Hence, the transistor 104 enables charging and discharging performed in order for the potential V2 to be applied to the node A, and the transistor 108 enables charging and discharging performed in order for the potential V1 to be applied to the node A. In other words, the above configuration makes it possible to set the potential of the node A to more than one types of potential values by only interchanging the potential Vext_b1 and the Vext_b2.

<Timing Chart>

Figure 7A:
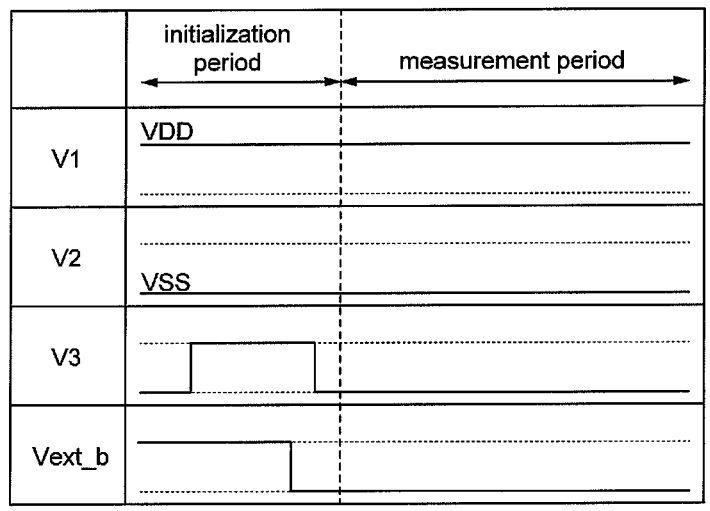
FIGS. 7A and 7B are diagrams (timing charts) showing voltage levels related to the operation of the systems of measurement.
Figure 7B:
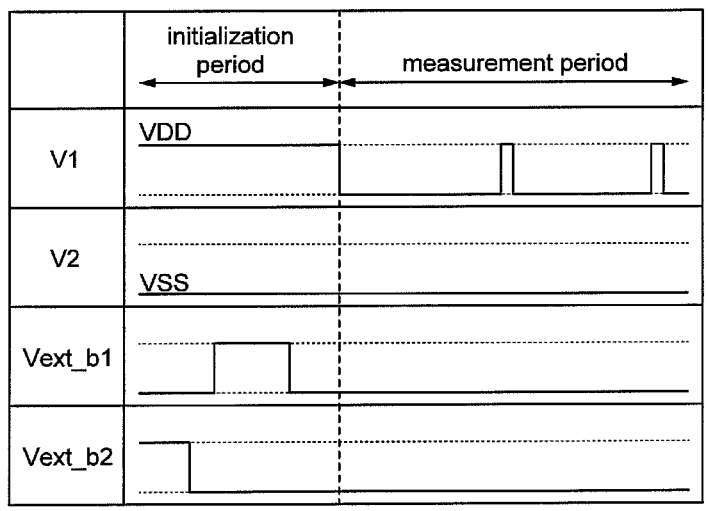

FIGS. 7A and 7B show the relationship between the voltage levels (a timing chart) in the above system of measurement. Here, two types of timing charts which are different in the type of system of measurement are shown.

FIG. 7A is an example of the timing chart in the case of using the system of measurement in FIG. 4A. In the initialization period, the potential Vext_b is set so that the transistor 104 may be turned on. Here, the potential Vext_b is high. In this state, a current flows between the source and the drain of the transistor 104, so that the potential V3 is applied to the node A. In the initialization period, V3 is set so that the potential of the node A may become a desired one.

In the subsequent measurement period, the potential Vext_b is set so that the transistor 104 may be turned off. In addition, the potential V3 is set so that charge may flow into the node A or charge may flow from the node A. Here, the potential V3 is low. Note that in order to hold the node A charged, it is preferable that the potential V3 be changed after the potential Vext_b is changed.

Note that in FIG. 7A, V3 and Vext_b are both high in the initialization period and low in the measurement period. One embodiment of the present invention, however, is not limited this; V3 and Vext_b may be low and high respectively in the initialization period and high and low respectively in the measurement period.

Note that the timing chart of FIG. 7A can be applied to the case of using the system of measurement shown in FIG. 4B or FIG. 4C.

FIG. 7B is an example of the timing chart in the case of using the system of measurement in FIG. 6. In the initialization period, the potential Vext_b2 is set so that the transistor 104 may be turned on. Consequently, the potential of the node A becomes V2, that is, a low potential (VSS). Then, the potential Vext_b2 is set so that the transistor 104 is turned off, and the transistor 104 is thus turned off. In a next step, the potential Vext_b1 is set so that the transistor 108 is turned on. Thus, the potential of the node A becomes V1, that is, a high potential (VDD). Subsequently, the potential Vext_b1 is set so that the transistor 108 is turned off. Consequently, the node A becomes floating, and the initialization period is terminated.

In the subsequent measurement period, the potential V1 and the potential V2 are set so that charge may flow to or from the node A. Here, the potential V1 and the potential V2 are low potential (VSS). Note that it is necessary to operate the output circuit at the timing of measuring the output potential Vout; thus, V1 is set to a high potential (VDD) temporarily.

By using the data obtained by the above operation for the method described in Embodiment 1, the off-state current of a transistor can be determined.

The structures and methods described in this embodiment can be combined as appropriate with any of those described in the other embodiments.

Embodiment 3

In this embodiment, another example of the system of measurement described in Embodiments 1 and 2 will be described with reference to FIG. 8. The configuration of the system of measurement described below can be used as the configuration of a test element group. Note that the system of measurement described below is only an example, and the present invention should not be construed as being limited thereto.

<System of Measurement>

Figure 8:
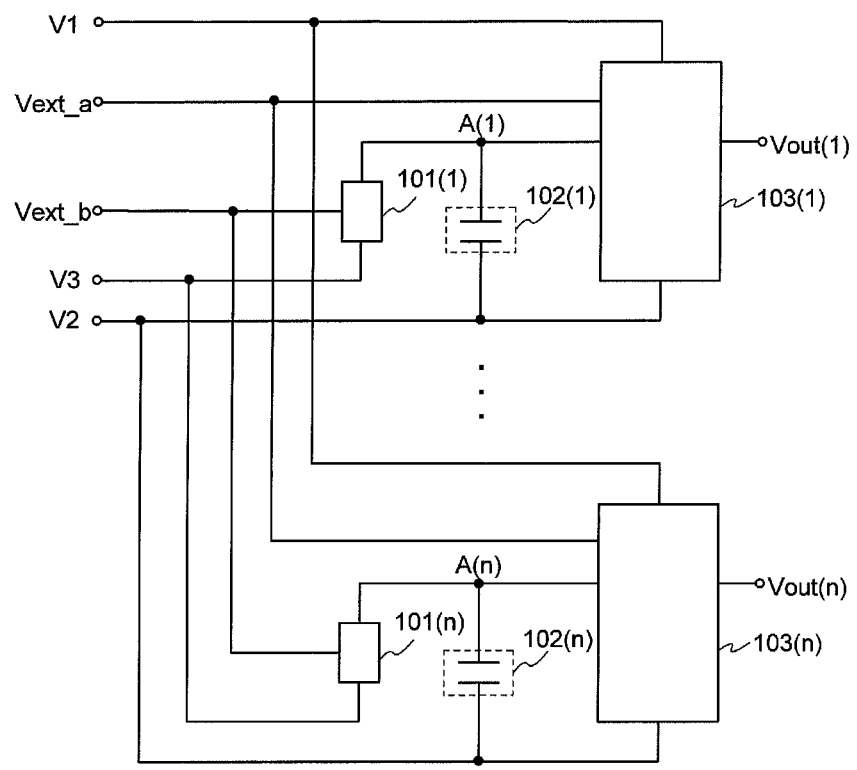
FIG. 8 is a circuit diagram showing an example of a system of measurement.

In a system of measurement shown in FIG. 8, a plurality of systems (n systems) of measurement similar to the system of measurement shown in FIG. 1 is connected in parallel. Specifically, the system of measurement shown in FIG. 8 includes electrical elements 101(1) to 101(n), capacitors 102(1) to 102(n), and output circuits 103(1) to 103(n).

Connections between the elements are the same as those in the system of measurement shown in FIG. 1. Embodiment 1 can be referred to for the details. Note that in the system of measurement in FIG. 8, the electrical elements 101(1) to 101(n) each have a third terminal, and the potential Vext_b is applied to each of the third terminals of the electrical elements 101(1) to 101(n) in order to control the conductance of the electrical elements 101(1) to 101(n). Further, the output circuits 103(1) to 103(n) each have a second input terminal, and the potential Vext_a is applied to the second input terminal.

<Current Measurement Method>

The current measurement method is basically the same as that described in Embodiment 1. Embodiment 1 can be referred to for the details.

The system of measurement in this embodiment has the advantage of being capable of performing a great number of measurements with small resources because its plurality of parallel-connected systems of measurement shares the power source and the like. The current measurement method according to one embodiment of the present invention is based on the measurement of a change in potential through time, and the current measurement thus requires some time in some cases. In view of this, such a parallel connection of systems of measurement shown in this embodiment produces a significant effect.

Further, it is possible to reduce the influence of noise in the potential V1, the potential V2, the potential V3, the potential Vext_a, the potential Vext_b, and the like from the exterior by determining a difference in the output potential of the plurality of parallel-connected circuits.

In addition, the plurality of parallel-connected systems of measurement makes it possible to determine the value of a current flowing through an electrical element without considering current other the current that flowing through the electrical element or parasitic capacitance by changing the parameters of the electrical element or the capacitor, and thus can increase the accuracy of the current measurement.

<Method of Removing Current Ileak>

A method for determining the value of a current flowing through an electrical element without considering current other than that flowing through the electrical element will be described below as an example. Note that here, the parameters of each electrical element are changed on the assumption that the capacitance of the node A (including the capacitance of the capacitor) is the same among the parallel-connected systems of measurement.

A system of measurement 1, the parameter of which is α1, and a system of measurement 2, the parameter of which is α2, are prepared, for example. Here, parameter α, which is one of the parameters of an electrical element, is proportional to a current flowing through the electrical element. Note that in the case where the electrical element is a transistor, an example of the parameter α is the channel width W.

As described in Embodiment 1, a current flowing through the node A is the sum of the current Idev and the current Ileak. Therefore, IA1 denoting a current flowing through a node A(1) in the system of measurement 1, and IA2 denoting a current flowing through a node A(2) in the system of measurement 2, are expressed by the following equations, where the current Idev0 is a current per unit α flowing through the node A (meaning that the current Idev in the system of measurement 1 equals Idev0·α1, and the current Idev in the system of measurement 2 equals Idev0·α2).

$$IA1 = Idev0 \cdot \alpha 1 + Ileak$$

$$IA2 = Idev0 \cdot \alpha 2 + Ileak$$

Idev0 is therefore expressed by the following equation.

$$Idev0 = \frac{IA2 - IA1}{\alpha 2 - \alpha 1}$$

The above equation shows that Idev0 does not include the current Ileak. Consequently, a current flowing through an electrical element can be determined with high accuracy even when unknown Ileak exists in a system of measurement. Note that it is preferable to carry out an analysis on the condition that VA1 and VA2 denoting the potentials of the nodes A are substantially the same for the reason that IA1 and IA2 depend on the potential of the node A. In other words, it is preferable to carry out an analysis on the condition that Vout1 and Vout2 are substantially the same because the configurations of the output circuits are substantially the same among the plurality of parallel-connected systems of measurement.

<Method of Removing Parasitic Capacitance>

A method for determining the value of a current flowing through an electrical element without considering parasitic capacitance C' will be described below as an example. Note that here, the parameters of a capacitor connected to the node A are changed on the assumption that the electrical elements are the same among the parallel-connected systems of measurement.

The system of measurement 1 in which the capacitance of a capacitor is expressed as C1 and the system of measurement 2 in which the capacitance of a capacitor is expressed as C2 are prepared, for example. This means that in the system of measurement 1, the capacitance of the node A(1) including parasitic capacitance is expressed as C1+C', and in the system of measurement 2, the capacitance of the node A(2) including parasitic capacitance is expressed as C2+C'.

The current IA is not dependent on the value of the capacitance of the node A if the potentials of the nodes A are the same among the parallel-connected systems of measurement, so that the expression IA1=IA2 is satisfied. Thus, the following equation is given by using IA1 and IA2.

$$I_A = (C1 + C')\frac{\Delta VA1}{\Delta t} - (C2 + C')\frac{\Delta VA2}{\Delta t}$$

C' is therefore expressed by the following equation.

$$C' = \frac{C2 \cdot \frac{\Delta VA2}{\Delta t} - C1 \cdot \frac{\Delta VA1}{\Delta t}}{\frac{\Delta VA1}{\Delta t} - \frac{\Delta VA2}{\Delta t}}$$

The current IA is expressed by the following expression substituting the above C'.

$$I_A = \frac{(C2 - C1)\frac{\Delta VA2}{\Delta t} \cdot \frac{\Delta VA1}{\Delta t}}{\frac{\Delta VA1}{\Delta t} - \frac{\Delta VA2}{\Delta t}}$$

The above equation shows that IA does not include capacitance other than C1 and C2. Consequently, the current IA can be determined with high accuracy even when unknown C' exists in a system of measurement. Note that it is preferable to carry out an analysis on the condition that VA1 and VA2, the potentials of the nodes A, are substantially the same, for the reason that IA1 and IA2 depend on the potential of the node A. In other words, it is preferable to carry out an analysis on the condition that Vout1 and Vout2 are substantially the same because the output circuit in each of the plurality of parallel-connected systems of measurement has the same configuration.

The structures and methods described in this embodiment can be combined as appropriate with any of those described in the other embodiments.

Embodiment 4

It is possible to examine whether or not an electrical element has predetermined characteristics by using the current measurement method described in Embodiment 1, 2 or 3.

For example, when a capacitor is used as the electrical element, it is possible to examine whether or not the value of a current leaking between the terminals of the capacitor is below a reference value. In addition, when a transistor is used as the electrical element, it is possible to examine whether or not the off-state current of the transistor is below a reference value, or to examine whether or not the gate leakage current of the transistor is below a reference value.

Further, when the fabrication process of a semiconductor device employs the above inspection method, defects in the semiconductor device can be accurately discovered.

The structures and methods described in this embodiment can be combined as appropriate with any of those described in the other embodiments.

Embodiment 5

It is possible to provide a semiconductor device having preferred characteristics by determining the parameters of an electrical element with the use of the current measurement method described in Embodiment 1, 2 or 3.

For example, determining the off-state current of a transistor accurately makes it possible to determine a minimum drive frequency or an optimum value for the channel width W of a transistor included in a semiconductor device that needs charge retention, such as a liquid crystal display. Thus, a semiconductor device with reduced power consumption can be achieved.

The structures and methods described in this embodiment can be combined as appropriate with any of those described in the other embodiments.

Embodiment 6

In this embodiment, a fabrication method of a semiconductor device using an oxide semiconductor (an amorphous one, in particular) will be described with reference to FIGS. 9A to 9E. A semiconductor device in this embodiment can be used as the electrical element 101 (e.g. the transistor 104) in Embodiments 1 and 2. Note that although a top-gate transistor will be taken as an example, the transistor does not need to be limited to a top-gate transistor.

First, an insulating layer 202 is formed over a substrate 200. Then, an oxide semiconductor layer 206 is formed over the insulating layer 202 (see FIG. 9A).

As the substrate 200, for example, a glass substrate can be used. The glass substrate is preferably a non-alkali glass substrate. As a material of the non-alkali glass substrate, a glass material such as aluminosilicate glass, aluminoborosilicate glass, or barium borosilicate glass is used, for example. As the substrate 200, in addition to a glass substrate, an insulating substrate formed using an insulator such as a ceramic substrate, a quartz substrate, or a sapphire substrate, a semiconductor substrate which is formed using a semiconductor material such as silicon and whose surface is covered with an insulating material, or a conductive substrate which is formed using a conductor such as metal or stainless steel and whose surface is covered with an insulating material can be used. A substrate formed from a flexible synthetic resin, such as plastic, generally tends to have a low allowable temperature limit, but can be used as the substrate 200 as long as the substrate can withstand the later fabrication process.

The insulating layer 202 functions as a base and can be formed by PVD, CVD or the like. The insulating layer 202 can be formed using an inorganic insulating material such as silicon oxide, silicon oxynitride, silicon nitride, hafnium oxide, aluminum oxide, or tantalum oxide. Note that it is preferable that the insulating layer 202 contain as little hydrogen or water as possible.

As the oxide semiconductor layer 206, any of the following oxide semiconductors can be used: an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxides; or an In—O-based oxide semiconductor, a Sn—O-based oxide semiconductor, or a Zn—O-based oxide semiconductor.

In particular, an In—Ga—Zn—O-based oxide semiconductor material has sufficiently high resistance when there is no electric field and off current can thus be sufficiently reduced. In addition, with high field-effect mobility, the In—Ga—Zn—O-based oxide semiconductor material is suitable for a semiconductor device.

A typical example of the In—Ga—Zn—O-based oxide semiconductor material is one represented by $InGaO_3(ZnO)_m$ (m>0). Another example is an oxide semiconductor material expressed by $InMO_3(ZnO)_m$ (m>0), where M is used instead of Ga. Here, M denotes one or more of metal elements selected from gallium (Ga), aluminum (Al), iron (Fe), nickel (Ni), manganese (Mn), cobalt (Co), and the like. For example, M may be Ga, Ga and Al, Ga and Fe, Ga and Ni, Ga and Mn, Ga and Co, or the like. Note that the above-described compositions are derived from the crystal structures that the oxide semiconductor material can have, and thus are only examples.

As a target for fabricating the oxide semiconductor layer 206 by sputtering, a target containing In, Ga, and Zn at a ratio of 1:x:y (x is 0 or more and y is 0.5 or more and 5 or less) may be used. For example, a target containing In, Ga, and Zn at a ratio of 1:1:1 [atomic ratio] (x=1 and y=1) (i.e., $In_2O_3$, $Ga_2O_3$, and ZnO at a ratio of 1:1:2 [molar ratio]) may also be used. In addition, a target containing In, Ga, and Zn at a ratio of 1:1:0.5 [atomic ratio] (x=1 and y=0.5), a target containing In, Ga, and Zn at a ratio of 1:1:2 [atomic ratio] (x=1 and y=2), or a target containing In, Ga, and Zn at a ratio of 1:0:1 [atomic ratio] (x=0 and y=1) may also be used.

In this embodiment, the oxide semiconductor layer 206 that is amorphous is formed by sputtering using an In—Ga—Zn—O-based metal oxide target.

The relative density of the metal oxide in the metal oxide target is 80% or more, preferably 95% or more, and more preferably 99.9% or more. The use of the metal oxide target with high relative density makes it possible to form the oxide semiconductor layer 206 that is dense.

The atmosphere in which the oxide semiconductor layer 206 is formed is preferably a rare gas (typically argon) atmosphere, an oxygen atmosphere, or a mixed atmosphere containing a rare gas (typically argon) and oxygen. Specifically, it is preferable to use, for example, a high-purity gas atmosphere in which the concentration of an impurity such as hydrogen, water, a hydroxyl group, or hydride is reduced to 1 ppm or less (preferably, 10 ppb or less).

At the time of forming the oxide semiconductor layer 206, for example, the substrate is held in a treatment chamber kept under reduced pressure and the substrate is heated to 100° C. or more and less than 550° C., preferably 200 to 400° C. Then, a sputtering gas from which hydrogen, water, and the like are removed is introduced into the treatment chamber while moisture in the treatment chamber is removed, whereby the oxide semiconductor layer 206 is formed using the aforementioned target. The oxide semiconductor layer 206 is formed while the substrate is heated, so that an impurity contained in the oxide semiconductor layer 206 can be reduced. Moreover, damage due to sputtering can be reduced. A sorption vacuum pump is preferably used in order to remove moisture remaining in the treatment chamber. For example, a cryopump, an ion pump, or a titanium sublimation pump can be used. Alternatively, a turbo molecular pump provided with a cold trap may also be used. Since hydrogen, water, and the like are removed from the treatment chamber evacuated with a cryopump, the concentration of an impurity in the oxide semiconductor layer 206 can be reduced.

The oxide semiconductor layer 206 can be formed, for example, under the following conditions: the distance between the substrate and the target is 170 mm; the pressure is 0.4 Pa; the direct-current (DC) power is 0.5 kW; and the atmosphere is oxygen (the proportion of oxygen is 100%), argon (the proportion of argon is 100%), or a mixed atmosphere containing oxygen and argon. Note that it is preferable to use a pulsed direct-current (DC) power source because dust (such as powder substances formed at the time of deposition) can be reduced and the thickness distribution is uniform. The thickness of the oxide semiconductor layer 206 is 2 nm to 200 nm, preferably 5 nm to 30 nm. Note that the appropriate thickness of the oxide semiconductor layer differs depending on the oxide semiconductor material to be used, the intended purpose of a semiconductor device, or the like; therefore, the thickness may be determined in accordance with the material, the intended purpose, or the like.

Note that before the oxide semiconductor layer 206 is formed by sputtering, reverse sputtering is preferably performed in which plasma is generated with an argon gas introduced, so that dust on the surface of the insulating layer 202 is removed. Here, the reverse sputtering is a method in which ions collide with a surface to be processed so that the surface is modified, in contrast to normal sputtering in which ions collide with a sputtering target. An example of a method for making ions collide with a surface to be processed is a method in which a high-frequency voltage is applied to the surface to be processed under an argon atmosphere so that plasma is generated near a substrate. Note that an atmosphere of nitrogen, helium, oxygen, or the like may be used instead of an argon atmosphere.

Next, the oxide semiconductor layer 206 is processed by a method such as etching using a mask, thereby forming an island-shaped oxide semiconductor layer 206a.

As an etching method for the oxide semiconductor layer 206, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape.

Examples of the etching gas used for dry etching include a gas containing chlorine (a chlorine-based gas such as chlorine ($Cl_2$), boron chloride ($BCl_3$), silicon chloride ($SiCl_4$), or carbon tetrachloride ($CCl_4$)). Moreover, a gas containing fluorine (a fluorine-based gas such as carbon tetrafluoride ($CF_4$), sulfur fluoride ($SF_6$), nitrogen fluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As the dry etching method, a parallel plate RIE (reactive ion etching) method or an ICP (inductively coupled plasma) etching method can be used. In order to etch the oxide semiconductor layer into a desired shape, etching conditions (e.g., the amount of electric power applied to a coiled electrode, the amount of electric power applied to an electrode on the substrate side, and the electrode temperature on the substrate side) are set as appropriate.

As an etchant used for wet etching, a solution obtained by mixing phosphoric acid, acetic acid, and nitric acid, an ammonia peroxide mixture (hydrogen peroxide water at 31 wt %: ammonia water at 28 wt %: water=5:2:2), or the like can be used. An etchant such as ITO07N (produced by KANTO CHEMICAL CO., INC.) may also be used.

After that, heat treatment (first heat treatment) is preferably performed on the oxide semiconductor layer 206a. Through the first heat treatment, excess hydrogen (including water and hydroxyl groups) in the oxide semiconductor layer 206a can be removed, the structure of the oxide semiconductor layer can be aligned, and a defect level of the energy gap in the oxide semiconductor layer 206a can be reduced. The first heat treatment is performed at 300° C. or more and less than 550° C., or a temperature of 400 to 500° C., for example. Note that performing the heat treatment after etching has the advantage of shortening the time for etching even when wet etching is used.

The heat treatment can be performed in such a manner that, for example, the substrate 200 is introduced into an electric furnace using a resistance heating element or the like, and then heated under a nitrogen atmosphere at 450° C. for one hour. The oxide semiconductor layer 206a is not exposed to the air during the heat treatment so that the entry of water or hydrogen may be prevented.

The heat treatment apparatus is not limited to the electric furnace and can be an apparatus for heating an object to be processed by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. As the gas, an inert gas which does not react with an object to be processed by heat treatment, for example, nitrogen or a rare gas such as argon is used.

For example, as the first heat treatment, a GRTA process may be performed as follows. The substrate is put in an inert gas atmosphere which is heated, heated for several minutes, and taken out of the inert gas atmosphere. The GRTA process enables high-temperature heat treatment for a short time. Moreover, the GRTA process can be employed even when the temperature exceeds the upper temperature limit of the substrate because it is heat treatment for a short time. Note that the inert gas may be changed during the process to a gas including oxygen. This is because defect levels in the energy gap caused by oxygen deficiency can be reduced by performing the first heat treatment under an atmosphere containing oxygen.

Note that as the inert gas atmosphere, it is preferable to employ an atmosphere that contains nitrogen or a rare gas (e.g., helium, neon, or argon) as its main component and that does not contain water, hydrogen, or the like. For example, the purity of nitrogen or a rare gas such as helium, neon, or argon introduced into the heat treatment apparatus is 6 N (99.9999%) or more, preferably 7 N (99.99999%) or more (i.e., the impurity concentration is 1 ppm or less, preferably 0.1 ppm or less).

In any case, when the impurity is reduced through the first heat treatment to form the i-type or substantially i-type oxide semiconductor layer 206a, a transistor with excellent characteristics can be achieved.

Note that the first heat treatment can also be performed on the oxide semiconductor layer 206 that has not yet been processed into the island-shaped oxide semiconductor layer 206a. In that case, after the first heat treatment, the substrate 200 is taken out of the heating apparatus and a photolithography step is performed.

The first heat treatment, which has an effect of removing hydrogen or water, can also be referred to as dehydration treatment, dehydrogenation treatment, or the like. The dehydration treatment or dehydrogenation treatment can be performed, for example, after the oxide semiconductor layer is formed, or after a source or drain electrode is stacked over the oxide semiconductor layer 206a. Such dehydration treatment or dehydrogenation treatment may be performed once or more than once.

Next, a conductive layer is formed to be in contact with the oxide semiconductor layer 206a. Then, a source or drain electrode 208a and a source or drain electrode 208b are formed by selectively etching the conductive layer (see FIG. 9B).

The conductive layer can be formed by PVD such as sputtering, CVD such as plasma CVD. As a material for the conductive layer, an element selected from aluminum, chromium, copper, tantalum, titanium, molybdenum, or tungsten; an alloy containing any of these elements as a component; or the like can be used. Alternatively, one or more materials selected from manganese, magnesium, zirconium, beryllium, and thorium may be used. Aluminum combined with one or more of elements selected from titanium, tantalum, tungsten, molybdenum, chromium, neodymium, or scandium may be used. The conductive layer may be a single layer or a stack of two or more layers. For example, the conductive layer may be a single layer of an aluminum film containing silicon, a two-layer film in which a titanium film is stacked over an aluminum film, or a three-layer film in which a titanium film, an aluminum film, and a titanium film are stacked in this order.

Alternatively, the conductive layer may be formed using conductive metal oxide. As conductive metal oxide, indium oxide ($In_2O_3$), tin oxide ($SnO_2$), zinc oxide (ZnO), indium oxide-tin oxide alloy ($In_2O_3$—$SnO_2$, which is abbreviated to ITO in some cases), indium oxide-zinc oxide alloy ($In_2O_3$—ZnO), or any of these metal oxide materials in which silicon or silicon oxide is contained can be used.

Figure 9A:
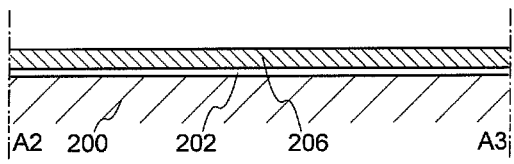
FIGS. 9A to 9E are cross-sectional views related to a fabrication process of a semiconductor device.
Figure 9B:
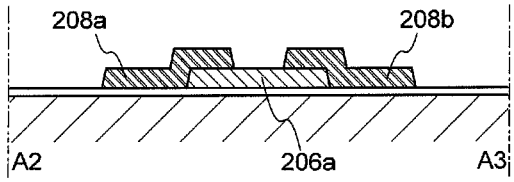
Figure 9C:
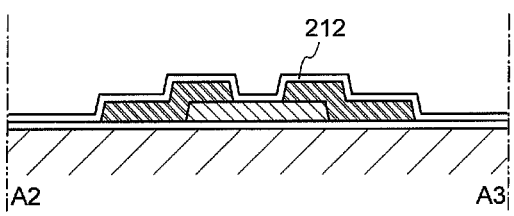

Next, a gate insulating layer 212 in contact with part of the oxide semiconductor layer 206a is formed (see FIG. 9C). The gate insulating layer 212 can be formed by CVD such as plasma CVD, sputtering, or the like. The gate insulating layer 212 preferably contains silicon oxide, silicon nitride, silicon oxynitride, aluminum oxide, hafnium oxide, tantalum oxide, or the like. Note that the gate insulating layer 212 may be either a single layer or a stack. There is no particular limitation on the thicknesses of the gate insulating layer 212, but it can be 10 nm to 500 nm, for example.

After the gate insulating layer 212 is formed, second heat treatment is preferably performed under an inert gas atmosphere or an oxygen atmosphere. The heat treatment is performed at 200 to 450° C., preferably 250 to 350° C. For example, the heat treatment may be performed at 250° C. for one hour under a nitrogen atmosphere. The second heat treatment can reduce variation in electric characteristics of the transistor. In the case where the gate insulating layer 212 contains oxygen, by supplying oxygen to the oxide semiconductor layer 206a to compensate oxygen deficiency of the oxide semiconductor layer 206a, an i-type (intrinsic) or substantially i-type oxide semiconductor layer can also be formed.

Note that although the second heat treatment is performed in this embodiment after the gate insulating layer 212 is formed, the timing of the second heat treatment is not limited thereto.

Figure 9D:
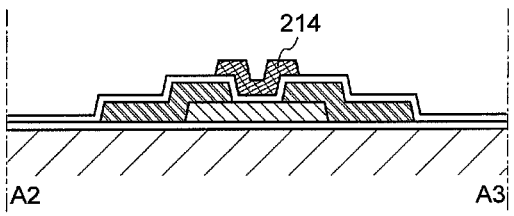

Next, a gate electrode 214 is formed over the gate insulating layer 212 in a region overlapping with the oxide semiconductor layer 206a (see FIG. 9D). The gate electrode 214 can be formed by forming a conductive layer over the gate insulating layer 212 and then patterning the conductive layer. The conductive layer to be the gate electrode 214 can be formed by PVD such as sputtering or CVD such as plasma CVD. The description of the source or drain electrode 208a can be referred to for the details of the gate electrode 214.

Figure 9E:
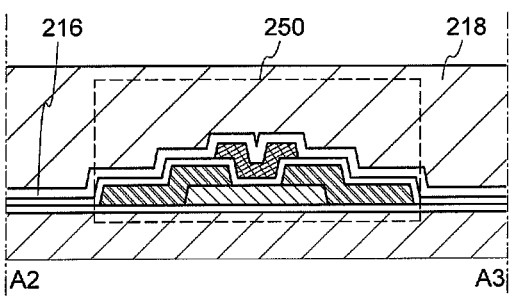

Next, an interlayer insulating layer 216 and an interlayer insulating layer 218 are formed over the gate insulating layer 212 and the gate electrode 214 (see FIG. 9E). The interlayer insulating layer 216 and the interlayer insulating layer 218 can be formed with PVD, CVD, or the like. Each of the interlayer insulating layer 216 and the interlayer insulating layer 218 can be formed using a material containing an inorganic insulating material such as silicon oxide, silicon oxynitride, silicon nitride, hafnium oxide, aluminum oxide, or tantalum oxide. Note that although the interlayer insulating layer 216 and the interlayer insulating layer 218 are stacked in this embodiment, one embodiment of the present invention is not limited to this. The interlayer can be a single layer or a stack of three or more layers.

Note that the interlayer insulating layer 218 is preferably formed so as to have a planarized surface. This is because an electrode, a wire, or the like can be favorably formed over the interlayer insulating layer 218 when the interlayer insulating layer 218 is formed so as to have a planarized surface.

Through the above steps, a transistor 250 including the highly purified oxide semiconductor layer 206a is completed (see FIG. 9E).

The transistor 250 illustrated in FIG. 9E includes: the oxide semiconductor layer 206a formed over the substrate 200 with the insulating layer 202 interposed therebetween; the source or drain electrode 208a and the source or drain electrode 208b electrically connected to the oxide semiconductor layer 206a; the gate insulating layer 212 covering the oxide semiconductor layer 206a, the source or drain electrode 208a, and the source or drain electrode 208b; the gate electrode 214 over the gate insulating layer 212; the interlayer insulating layer 216 over the gate insulating layer 212 and the gate electrode 214; and the interlayer insulating layer 218 over the interlayer insulating layer 216.

The transistor 250 described in this embodiment has the highly purified oxide semiconductor layer 206a. The concentration of hydrogen in the oxide semiconductor layer 206a is therefore $5\times10^{19}$ atoms/cm$^3$ or less, preferably $5\times10^{18}$ atoms/cm$^3$ or less, or more preferably $5\times10^{17}$ atoms/cm$^3$ or less. In addition, the carrier density of the oxide semiconductor layer 206a is sufficiently low (e.g., less than $1\times10^{12}$/cm$^3$, preferably less than $1.45\times10^{10}$/cm$^3$) as compared to that of a typical silicon wafer (approximately $1\times10^{14}$/cm$^3$). As a result, a sufficiently low off current can be obtained. For example, in the case where a channel length is 10 μm, the thickness of the oxide semiconductor layer is 30 nm, and a drain voltage ranges approximately from 1 V to 10 V, off current (a drain current obtained when a gate-source voltage is 0 V or less) is $1\times10^{-13}$ A or less. Then, the current measurement method described in Embodiments 1 to 3 enables the off current density (a value obtained by dividing the off current by the channel width of the transistor) of the transistor 250 at room temperature to be determined to be approximately $1\times10^{-20}$ A (10 zA) to $1\times10^{-19}$ A (100 zA).

Note that the characteristics of the above transistor can be represented using off resistance (a resistance value when the transistor is turned off) or off resistivity (resistivity when the transistor is turned off) in addition to the off current or the off current density. Here, off resistance R is determined by Ohm's law with the use of the off current and the drain voltage. In addition, with the use of a cross-sectional area A of a channel formation region and a channel length L, off resistivity $\rho$ is determined by the expression $\rho=RA/L$. Specifically, in the above case, the off resistivity is $1\times10^9$ $\Omega\cdot m$ or more (or $1\times10^{10}$ $\Omega\cdot m$ or more). Note that with the use of the thickness d of the oxide semiconductor layer and the channel width W, the cross-sectional area A is determined by the expression A=dW.

The use of the oxide semiconductor layer 206a which is highly purified and made intrinsic in such a manner makes it possible to sufficiently reduce the off current of the transistor.

The transistor 250 fabricated in this embodiment has the highly purified oxide semiconductor layer 206a, and thus provides an off-state current of $1\times10^{-13}$ A or less. In such a case, it is difficult to precisely measure the value of the off-state current of a transistor such as that fabricated in this embodiment, with a conventional technique for measuring off-state current whose detectable limit is approximately 10 fA.

In the current measurement method described in the above-mentioned embodiments, a current is not directly measured; instead, a current is measured by detecting a change in potential through time, thereby allowing a minute current to be detected. This enables the detection of a current of 10 fA or less, which has been difficult to achieve, for example, the detection of a current value of even 1 zA or less. By using the above current measurement method as an inspection method and employing it in the fabrication process of a transistor, an inspection is conducted to determine whether or not the transistor has predetermined characteristics, and defects in the transistor thus can be discovered accurately. Further, a semiconductor device having preferred characteristics can be fabricated by determining the parameters of the semiconductor device on the basis of current values determined by the current measurement method described in Embodiments 1 to 3.

The structures and methods described in this embodiment can be combined as appropriate with any of those described in the other embodiments.

Embodiment 7

In this embodiment, a fabrication method of a semiconductor device using an oxide semiconductor will be described with reference to FIGS. 10A to 10E. In this embodiment, description is made in detail on the case where, as an oxide semiconductor layer, a first oxide semiconductor layer having a crystallized region and a second oxide semiconductor layer that is obtained by crystal growth from the crystallized region of the first oxide semiconductor layer are used. A semiconductor device in this embodiment can be used as the electrical element 101 (e.g. the transistor 104) in Embodiments 1 and 2. Note that although a top-gate transistor will be taken as an example, the transistor does not need to be limited to a top-gate transistor.

First, an insulating layer 302 is formed over a substrate 300. Next, a first oxide semiconductor layer is formed over the insulating layer 302, and then subjected to first heat treatment so that a region including at least a surface of the first oxide semiconductor layer is crystallized, thereby forming a first oxide semiconductor layer 304 (see FIG. 10A).

As the substrate 300, a substrate similar to the substrate 200 in Embodiment 6 can be used. Embodiment 6 may be referred to for the details.

The insulating layer 302 serves as a base and can be formed in a manner similar to that of the insulating layer 202 shown in Embodiment 6. Embodiment 6 may be referred to for the details. Note that it is preferable that the insulating layer 302 contain as little hydrogen or water as possible.

The first oxide semiconductor layer can be formed in a manner similar to that of the oxide semiconductor layer 206 described in Embodiment 6. Embodiment 6 can be referred to for the details of the first oxide semiconductor layer and the deposition method thereof. Note that in this embodiment, the first oxide semiconductor layer is intentionally crystallized through the first heat treatment; therefore, the first oxide semiconductor layer is preferably formed using an oxide semiconductor which causes crystallization easily. For example, ZnO or the like can be given as such an oxide semiconductor. Further, it is also preferable to use an In—Ga—Zn—O-based oxide semiconductor in which the proportion of Zn in metal elements (In, Ga, Zn) is 60% or more, because an In—Ga—Zn—O-based oxide semiconductor containing Zn at high concentration is easily crystallized. The thickness of the first oxide semiconductor layer is preferably 3 nm to 15 nm, and in this embodiment, 5 nm for example. Note that the appropriate thickness of the first oxide semiconductor layer differs depending on the oxide semiconductor material to be used, the intended purpose of a semiconductor device, or the like; therefore, the thickness may be determined in accordance with the material, the intended purpose, or the like.

The first heat treatment is performed at 550 to 850° C., preferably 600 to 750° C. The time for the first heat treatment is preferably 1 minute to 24 hours. The temperature and time of the heat treatment differ depending on the kind or the like of the oxide semiconductor. In addition, the first heat treatment is preferably performed in an atmosphere that does not contain hydrogen or water, such as an atmosphere of nitrogen, oxygen, or a rare gas (e.g., helium, neon, or argon), from which water is sufficiently removed.

The heat treatment apparatus is not limited to the electric furnace and can be an apparatus for heating an object to be processed by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. As the gas, an inert gas which does not react with an object to be processed by heat treatment, for example, nitrogen or a rare gas such as argon is used.

Through the first heat treatment, a region including at least the surface of the first oxide semiconductor layer is crystallized. The crystallized region is formed in such a manner that crystal growth proceeds from the surface of the first oxide semiconductor layer toward the inside of the first oxide semiconductor layer. Note that in some cases, the crystallized region includes a plate-like crystal with an average thickness of 2 nm to 10 nm. In some cases, the crystallized region also includes a crystal which has an a-b surface substantially parallel to the surface of the oxide semiconductor layer and is c-axis-aligned in a direction substantially perpendicular to the surface of the oxide semiconductor layer. Here, a "direction substantially parallel" means a direction within ±10° of the parallel direction, and a "direction substantially perpendicular" means a direction within ±10° of the perpendicular direction.

Through the first heat treatment during which the crystallized region is formed, hydrogen (including water or hydroxyl groups) and the like in the first oxide semiconductor layer is preferably removed. In order to remove hydrogen and the like, the first heat treatment may be performed under an atmosphere of nitrogen, oxygen, or a rare gas (e.g., helium, neon, or argon), whose purity is 6 N (99.9999%) or more (i.e., the impurity concentration is 1 ppm or less), more preferably 7 N (99.99999%) or more (i.e., the impurity concentration is 0.1 ppm or less). Alternatively, the first heat treatment may be performed in ultra-dry air containing $H_2O$ of 20 ppm or less, preferably 1 ppm or less.

Furthermore, through the first heat treatment during which the crystallized region is formed, oxygen is preferably supplied to the first oxide semiconductor layer. Oxygen can be supplied to the first oxide semiconductor layer by, for example, changing the atmosphere for the heat treatment to an oxygen atmosphere.

The first heat treatment in this embodiment is as follows: hydrogen and the like are removed from the oxide semiconductor layer through heat treatment under a nitrogen atmosphere at 700° C. for one hour, and then the atmosphere is changed to an oxygen atmosphere so that oxygen is supplied to the inside of the first oxide semiconductor layer. Note that the main purpose of the first heat treatment is to form the crystallized region, so that treatment for removing hydrogen and the like and treatment for supplying oxygen may be performed separately. For example, heat treatment for crystallization can be performed after heat treatment for removing hydrogen and the like and treatment for supplying oxygen.

Through such first heat treatment, the crystallized region is formed, hydrogen (including water and hydroxyl groups) and the like are removed, and the first oxide semiconductor layer supplied with oxygen can be obtained.

Figure 10A:
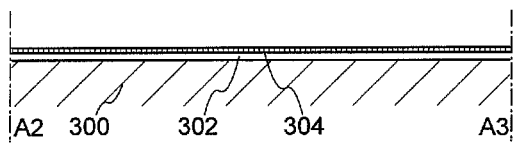
FIGS. 10A to 10E are cross-sectional views related to a fabrication process of a semiconductor device.
Figure 10B:
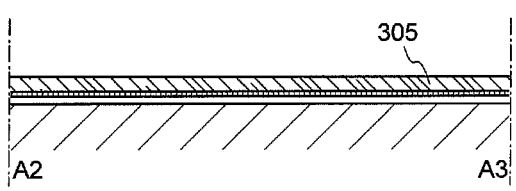

Next, a second oxide semiconductor layer 305 is formed over the first oxide semiconductor layer 304 including the crystallized region at least on its surface (see FIG. 10B).

The second oxide semiconductor layer 305 can be formed in a manner similar to that of the oxide semiconductor layer 206 shown in Embodiment 6. Embodiment 6 can be referred to for the details of the second oxide semiconductor layer 305 and a fabrication method thereof. Note that the second oxide semiconductor layer 305 is preferably formed to be thicker than the first oxide semiconductor layer 304. Further, the second oxide semiconductor layer 305 is preferably formed so that the total thickness of the first oxide semiconductor layer 304 and the second oxide semiconductor layer 305 may be 3 nm to 50 nm. Note that the appropriate thickness of the oxide semiconductor layer differs depending on the oxide semiconductor material to be used, the intended purpose of a semiconductor device, or the like. The thickness may therefore be determined in accordance with the material, the intended purpose, or the like.

The second oxide semiconductor layer 305 and the first oxide semiconductor layer 304 are preferably formed using materials which have the same main component and have close lattice constants after crystallization (lattice mismatch is 1% or less). This is because in the crystallization of the second oxide semiconductor layer 305, crystal growth easily proceeds from the crystallized region of the first oxide semiconductor layer 304 in the case where materials having the same main component and close lattice constants are used. In addition, the use of materials having the same main component and close lattice constants enables favorable interface physical properties or electric characteristics.

Note that in the case where a desired film quality is obtained through crystallization, the second oxide semiconductor layer 305 may be formed using a material whose main component is different from that of the first oxide semiconductor layer 304.

Next, second heat treatment is performed on the second oxide semiconductor layer 305. Consequently, crystal growth proceeds from the crystallized region of the first oxide semiconductor layer 304, and a second oxide semiconductor layer 306 is formed (see FIG. 10C).

The second heat treatment is performed at 550 to 850° C., preferably 600 to 750° C. The time for the second heat treatment is 1 minute to 100 hours, preferably 5 hours to 20 hours, and typically 10 hours. Note that also the second heat treatment is preferably performed under an atmosphere that does not contain hydrogen or water.

The details of the atmosphere and the effect of the heat treatment are similar to those of the first heat treatment. The heat treatment apparatus that can be used is also similar to that of the first heat treatment. For example, in the second heat treatment, a furnace is filled with a nitrogen atmosphere when a temperature rises, and the furnace is filled with an oxygen atmosphere when the temperature falls, thereby removing hydrogen and the like under the nitrogen atmosphere and supplying oxygen under the oxygen atmosphere.

Through the second heat treatment, crystal growth can proceed from the crystallized region of the first oxide semiconductor layer 304 to the whole of the second oxide semiconductor layer 305, thereby forming the second oxide semiconductor layer 306. In addition, it is possible to form the second oxide semiconductor layer 306 from which hydrogen (including water and hydroxyl groups) and the like are removed and to which oxygen is supplied. Furthermore, the orientation of the crystallized region of the first oxide semiconductor layer 304 can be improved through the second heat treatment.

For example, in the case where an In—Ga—Zn—O-based oxide semiconductor material is used for the second oxide semiconductor layer 306, the second oxide semiconductor layer 306 can include a crystal represented by $InGaO_3(ZnO)_m$ (m is a natural number), a crystal represented by $In_2Ga_2ZnO_7$ (In:Ga:Zn:O=2:2:1:7 [atomic ratio]), or the like. Such crystals are aligned through the second heat treatment so that a c-axis may be in a direction substantially perpendicular to the surface of the second oxide semiconductor layer 306a.

Here, it can be said that the aforementioned crystals include any of In, Ga, and Zn, and are layered crystals whose layers are parallel to the a-axis and the b-axis. Specifically, each of the aforementioned crystals includes a layer that contains In and a layer that does not contain In (a layer containing Ga or Zn) which are layered in the c-axis direction.

In an In—Ga—Zn—O-based oxide semiconductor crystal, the conductivity of a layer containing In in the in-plane direction, i.e. in a direction parallel to the a-axis and the b-axis is favorable. This is because electrical conduction in the In—Ga—Zn—O-based oxide semiconductor crystal is mainly controlled by In, and because the 5s orbital of an In atom overlaps with the 5s orbital of an adjacent In atom and a carrier path is thus formed.

Further, in the case where the first oxide semiconductor layer 304 includes an amorphous region at the interface with the insulating layer 302, through the second heat treatment, crystal growth proceeds in some cases from the crystallized region formed on the surface of the first oxide semiconductor layer 304 toward the bottom of the first oxide semiconductor layer to crystallize the amorphous region. Note that in some cases, the amorphous region remains depending on the material of the insulating layer 302, the heat treatment conditions, and the like.

Figure 10C:
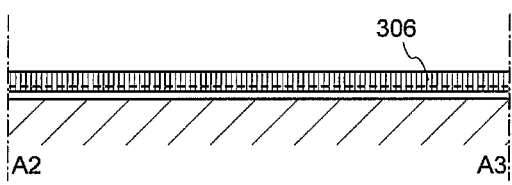

In the case where the first oxide semiconductor layer 304 and the second oxide semiconductor layer 305 are formed using oxide semiconductor materials having the same main component, in some cases, the first oxide semiconductor layer 304 and the second oxide semiconductor layer 306 have the same crystal structure, as illustrated in FIG. 10C. Therefore, although indicated by a dotted line in FIG. 10C, the boundary between the first oxide semiconductor layer 304 and the second oxide semiconductor layer 306 might not be distinguished, so that the first oxide semiconductor layer 304 and the second oxide semiconductor layer 306 might be regarded as the same layer.

Figure 10D:
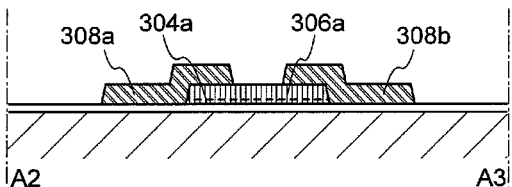

Next, the first oxide semiconductor layer 304 and the second oxide semiconductor layer 306 are processed by etching using a mask or the like, thereby forming an island-shaped first oxide semiconductor layer 304a and an island-shaped second oxide semiconductor layer 306a (see FIG. 10D). Note that here, processing for forming the island-shaped oxide semiconductor is performed after the second heat treatment; however, the second heat treatment may be performed after the processing for forming the island-shaped oxide semiconductor layer. Note that in this case, there is the advantage that the time for etching is shortened even when wet etching is used.

As an etching method for the first oxide semiconductor layer 304 and the second oxide semiconductor layer 306, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape. The first oxide semiconductor layer 304 and the second oxide semiconductor layer 306 can be etched in a manner similar to that of the oxide semiconductor layer shown in Embodiment 6. Embodiment 6 can be referred to for the details.

A region of the oxide semiconductor layers, which becomes a channel formation region, preferably has a planarized surface. For example, the surface of the second oxide semiconductor layer 306 preferably has a peak-to-valley height of 1 nm or less (more preferably 0.2 nm or less) in a region overlapping with a gate electrode (the channel formation region).

Next, a conductive layer is formed to be in contact with the second oxide semiconductor layer 306a. Then, a source or drain electrode 308a and a source or drain electrode 308b are formed by selectively etching the conductive layer (see FIG. 10D). The source or drain electrode 308a and the source or drain electrode 308b can be formed in a manner similar to that of the source or drain electrode 208a and the source or drain electrode 208b shown in Embodiment 6. Embodiment 6 can be referred to for the details.

In the step illustrated in FIG. 10D, crystal layers on the side surfaces of the first oxide semiconductor layer 304a and the second oxide semiconductor layer 306a, which are in contact with the source or drain electrode 308a and the source or drain electrode 308b, are amorphous in some cases. For this reason, all the regions of the first oxide semiconductor layer 304a and the second oxide semiconductor layer 306a are not always crystalline.

Next, a gate insulating layer 312 in contact with part of the second oxide semiconductor layer 306a is formed. The gate insulating layer 312 can be formed by sputtering, CVD such as plasma CVD, or the like. Then, a gate electrode 314 is formed over the gate insulating layer 312 in a region overlapping with the first oxide semiconductor layer 304a and the second oxide semiconductor layer 306a. After that, an interlayer insulating layer 316 and an interlayer insulating layer 318 are formed over the gate insulating layer 312 and the gate electrode 314 (see FIG. 10E). The gate insulating layer 312, the gate electrode 314, the interlayer insulating layer 316, and the interlayer insulating layer 318 can be formed in a manner similar to that of the gate insulating layer 212, the gate electrode 214, the interlayer insulating layer 216, and the interlayer insulating layer 218, respectively, shown in Embodiment 6. Embodiment 6 can be referred to for the details.

After the gate insulating layer 312 is formed, third heat treatment is preferably performed under an inert gas atmosphere or an oxygen atmosphere. The third heat treatment is performed at 200 to 450° C., preferably 250 to 350° C. For example, the heat treatment may be performed at 250° C. for one hour under an atmosphere containing oxygen. The third heat treatment can reduce variations between transistors in electric characteristics. In the case where the gate insulating layer 312 contains oxygen, by supplying oxygen to the second oxide semiconductor layer 306a to compensate oxygen deficiency of the second oxide semiconductor layer 306a, an i-type (intrinsic) or substantially i-type oxide semiconductor layer can also be formed.

Note that although the third heat treatment is performed in this embodiment after the gate insulating layer 312 is formed, the timing of performing the third heat treatment is not limited thereto. Further, the third heat treatment may be omitted in the case where oxygen is supplied to the second oxide semiconductor layer by another treatment such as the second heat treatment.

Through the above steps, a transistor 350 is completed. The transistor 350 uses the first oxide semiconductor layer 304a and the second oxide semiconductor layer 306a which is obtained by crystal growth from the crystallized region of the first oxide semiconductor layer 304a (see FIG. 10E).

Figure 10E:
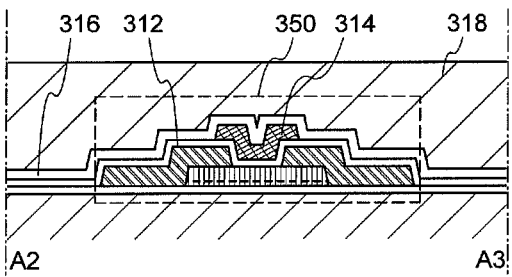

The transistor 350 illustrated in FIG. 10E includes: the first oxide semiconductor layer 304a formed over the substrate 300 with the insulating layer 302 interposed therebetween; the second oxide semiconductor layer 306a formed over the first oxide semiconductor layer 304a; the source or drain electrode 308a and the source or drain electrode 308b electrically connected to the second oxide semiconductor layer 306a; the gate insulating layer 312 covering the second oxide semiconductor layer 306a, the source or drain electrode 308a, and the source or drain electrode 308b; the gate electrode 314 over the gate insulating layer 312; the interlayer insulating layer 316 over the gate insulating layer 312 and the gate electrode 314; and the interlayer insulating layer 318 over the interlayer insulating layer 316.

The transistor 350 shown in this embodiment has the first oxide semiconductor layer 304a and the second oxide semiconductor layer 306a which are highly purified. The concentration of hydrogen in the first oxide semiconductor layer 304a and the second oxide semiconductor layer 306a is therefore $5\times10^{19}/cm^3$ or less, preferably $5\times10^{18}/cm^3$ or less, and more preferably $5\times10^{17}/cm^3$ or less. In addition, the carrier density of the oxide semiconductor layers is sufficiently low (e.g., less than $1\times10^{12}/cm^3$, preferably less than $1.45\times10^{10}/cm^3$) as compared to that of a typical silicon wafer (approximately $1\times10^{14}/cm^3$). As a result, a sufficiently low off-state current can be obtained. For example, in the case where a channel length of the transistor is 10 μm and the thickness of the oxide semiconductor layer is 30 nm, when a drain voltage ranges from 1 V to 10 V, the off current (a drain current obtained when a gate-source voltage is 0 V or less) is $1\times10^{-13}$ A or less. Then, the current measurement method described in Embodiments 1 to 3 enables the off current density (a value obtained by dividing the off current by the channel width of the transistor) of the transistor 350 at room temperature to be determined to be approximately $1\times10^{-20}$ A (10 zA) to $1\times10^{-19}$ A (100 zA).

Note that the characteristics of the above transistor can be represented using off resistance (a resistance value when the transistor is turned off) or off resistivity (resistivity when the transistor is turned off) in addition to the off current or the off current density. Here, off resistance R is determined by Ohm's law with the use of the off current and the drain voltage. In addition, with the use of a cross-sectional area A of a channel formation region and a channel length L, off resistivity ρ is determined by the expression ρ=RA/L. Specifically, in the above case, the off resistivity is $1\times10^9$ Ω·m or more (or $1\times10^{10}$ Ω·m or more). Note that with the use of the thickness d of the oxide semiconductor layer and the channel width W, the cross-sectional area A is determined by the expression A=dW.

The use of the first oxide semiconductor layer 304a and the second oxide semiconductor layer 306a that are highly purified and made intrinsic in such a manner makes it possible to sufficiently reduce the off current of the transistor.

Further, in this embodiment, the first oxide semiconductor layer 304a including the crystal region and the second oxide semiconductor layer 306a formed by crystal growth from the crystal region of the first oxide semiconductor layer 304a are used as the oxide semiconductor layer, thereby achieving a transistor having improved field-effect mobility and favorable electric characteristics.

The transistor 350 fabricated in this embodiment has the highly purified oxide semiconductor layers 304a and 306a, and thus provides an off-state current of $1\times10^{-13}$ A or less. In such a case, it is difficult to precisely measure the value of the off-state current of a transistor such as that fabricated in this embodiment, with a conventional technique for measuring off-state current whose detectable limit is approximately 10 fA.

In the current measurement method described in this embodiment, a current is not directly measured; instead, a current is measured by detecting a change in potential through time, thereby allowing a minute current to be detected. This enables the detection of a current of 10 fA or less, which has been difficult to achieve, for example, the detection of a current value of even 1 zA or less. By using the above current measurement method as an inspection method and employing it in the fabrication process of a transistor, an inspection is conducted to determine whether or not the transistor has predetermined characteristics, and defects in the transistor thus can be discovered accurately. Further, a semiconductor device having preferred characteristics can be fabricated by determining the parameters of the semiconductor device on the basis of current values determined by the current measurement method described Embodiments 1 to 3.

The structures and methods described in this embodiment can be combined as appropriate with any of those described in the other embodiments.

Example

In this example, the results of current measurement actually carried out using one embodiment of the present invention are shown. Note that in this example, current measurement was performed with a system of measurement in FIG. 8 having three parallel-connected systems of measurement each of which is one shown in FIG. 6. Further, in this example, an electrical element was a transistor using a highly purified oxide semiconductor, whose channel length L and channel width W are 10 μm and 50 μm, respectively, and the off-state current of the transistor was measured. In addition, the parallel-connected systems of measurement had capacitors whose capacitances were 100 fF, 1 pF, and 3 pF, respectively.

The relationship between the voltage levels were decided according to the timing chart of FIG. 7B. Note that in the measurement according to this example, VDD was 5 V and VSS was 0 V. In the measurement period, Vout was measured on the condition that the potential V1 is basically VSS and is VDD only during a period of 100 msec which comes every 10 to 300 sec.

Δt which was used to calculate current I representing a current flowing through the element was 30000 sec.

Figure 11:
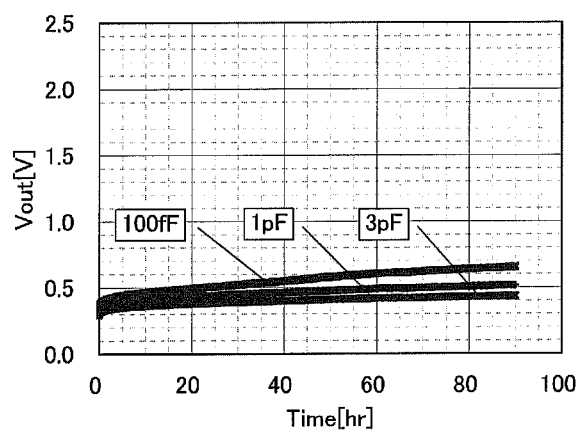
FIG. 11 is a graph showing measurement results (a graph showing the relation between the elapsed time (Time) and the output potential (Vout)).

FIG. 11 shows an example of the relation between the elapsed time (Time) and the output potential (Vout). A change in potential can be observed after about 90 hours passed.

Figure 12:
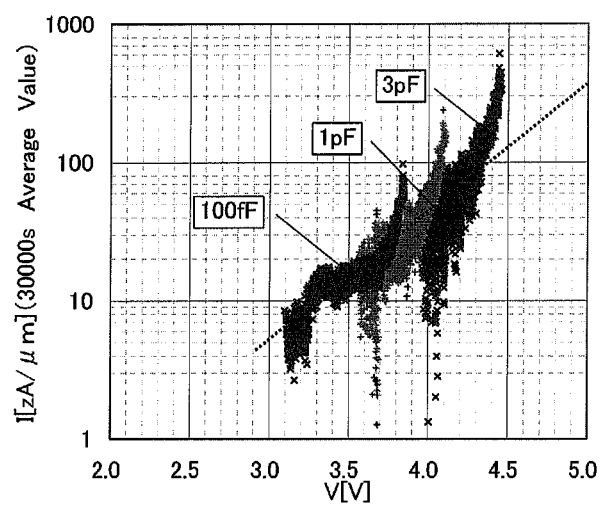
FIG. 12 is a graph showing measurement results (a graph showing the relation between source-drain voltage V and off-state current I).

FIG. 12 shows the values of the off-state current that were calculated by the above current measurement method. Note that FIG. 12 shows the relation between the source-drain voltage V and the off-state current I. FIG. 12 shows that the off-state current is about 40 zA/μm when the source-drain voltage is 4 V. Note that 1 zA equals $10^{-21}$ A.

This application is based on Japanese Patent Application serial no. 2009-287978 filed with Japan Patent Office on Dec. 18, 2009, the entire contents of which are hereby incorporated by reference.

What is claimed is:

1. A method for measuring current, comprising the steps of:
   applying a predetermined potential to a first terminal of an electrical element comprising the first terminal and a second terminal for a period;
   measuring an amount of decrease in potential over time of the period of a node connected to the second terminal while a potential of the first terminal is fixed and a potential of the second terminal is floating; and
   calculating, from the amount of decrease in potential, a value of a current flowing between the first terminal and the second terminal of the electrical element.

2. The method for measuring current according to claim 1, wherein the electrical element is a transistor in which a current flowing between a source and a drain when the transistor is in an off state is less than $10^{-14}$ A,
   wherein the first terminal is one of the source and the drain,
   wherein the second terminal is the other of the source and the drain, and
   wherein by forcing the transistor into the off state, a value of a current flowing when the transistor is in the off state is calculated.

3. The method for measuring current according to claim 1, wherein a capacitor is connected to the node.

4. A method for inspecting a semiconductor device, comprising the step of:

inspecting whether or not the electrical element has predetermined characteristics by using the method for measuring current according to claim 1.

5. The method for measuring current according to claim 1, wherein the value of the current is less than $10^{-14}$ A.

6. The method for measuring current according to claim 1, wherein the period is more than 90 hours.

7. A method for measuring current, comprising the steps of:
applying a predetermined potential to a first terminal of an electrical element comprising the first terminal and a second terminal for a period;
supplying charge to a node connected to the second terminal;
measuring an amount of decrease in potential over time of the period of the node due to a change in an amount of charge held in a capacitor connected to the node while a potential of the first terminal is fixed and a potential of the second terminal is floating; and
calculating, from the amount of decrease in potential, a value of a current flowing between the first terminal and the second terminal of the electrical element.

8. The method for measuring current according to claim 7, wherein the electrical element is a transistor in which a current flowing between a source and a drain when the transistor is in an off state is less than $10^{-14}$ A,
wherein the first terminal is one of the source and the drain,
wherein the second terminal is the other of the source and the drain, and
wherein by forcing the transistor into the off state, a value of a current flowing when the transistor is in the off state is calculated.

9. A method for inspecting a semiconductor device, comprising the step of:
inspecting whether or not the electrical element has predetermined characteristics by using the method for measuring current according to claim 7.

10. The method for measuring current according to claim 7, wherein the value of the current is less than $10^{-14}$ A.

11. The method for measuring current according to claim 7, wherein the period is more than 90 hours.

12. A method for measuring current, comprising the steps of:
applying a predetermined potential between a first terminal and a second terminal of an electrical element for a period;
measuring an amount of decrease in potential over time of the period of a node connected to the second terminal while a potential of the first terminal is fixed and a potential of the second terminal is floating; and
calculating, from the amount of decrease in potential, a value of a current flowing between the first terminal and the second terminal of the electrical element.

13. The method for measuring current according to claim 12,
wherein the electrical element is a transistor in which a current flowing between a source and a drain when the transistor is in an off state is less than $10^{-14}$ A,
wherein the first terminal is one of the source and the drain,
wherein the second terminal is the other of the source and the drain, and
wherein by forcing the transistor into the off state, a value of a current flowing when the transistor is in the off state is calculated.

14. The method for measuring current according to claim 12, wherein a capacitor is connected to the node.

15. A method for inspecting a semiconductor device, comprising the step of:
inspecting whether or not the electrical element has predetermined characteristics by using the method for measuring current according to claim 12.

16. The method for measuring current according to claim 12, wherein the value of the current is less than $10^{-14}$ A.

17. The method for measuring current according to claim 12, wherein the period is more than 90 hours.

* * * * *